US010797211B2

(12) United States Patent
Baldo et al.

(10) Patent No.: US 10,797,211 B2
(45) Date of Patent: Oct. 6, 2020

(54) METHOD OF MANUFACTURING SUPPORT STRUCTURES FOR LIGHTING DEVICES AND CORRESPONDING DEVICE

(71) Applicant: OSRAM GmbH, Munich (DE)

(72) Inventors: Lorenzo Baldo, Glavera del Montello (IT); Alessio Griffoni, Fossò (IT); Federico Poggi, Venice (IT)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 15/688,926

(22) Filed: Aug. 29, 2017

(65) Prior Publication Data

US 2018/0062054 A1 Mar. 1, 2018

(30) Foreign Application Priority Data

Aug. 30, 2016 (IT) .................... 102016000088158

(51) Int. Cl.
*H01L 21/48* (2006.01)
*H01L 33/62* (2010.01)
(Continued)

(52) U.S. Cl.
CPC ............ *H01L 33/62* (2013.01); *F21V 19/005* (2013.01); *F21V 23/005* (2013.01);
(Continued)

(58) Field of Classification Search
CPC ..... H01L 33/62; H01L 33/005; H01L 33/483; H01L 21/486; H01L 21/4867;
(Continued)

(56) References Cited

U.S. PATENT DOCUMENTS 8,067,270 B2 * 11/2011 Lin ...................... H05K 1/0204
257/E33.056
8,823,144 B2 * 9/2014 Khan ...................... H01L 23/12
257/621
(Continued)

FOREIGN PATENT DOCUMENTS

WO 2015135827 A1 9/2015

OTHER PUBLICATIONS

Italian Search Report based on application No. 201600088158 (8 pages) dated May 10, 2017.

*Primary Examiner* — Cuong Q Nguyen
(74) *Attorney, Agent, or Firm* — Viering, Jentschura & Partner mbB

(57) ABSTRACT

A method of manufacturing support elements for lighting devices includes: providing an elongated, electrically non-conductive substrate with opposed surfaces, with an electrically-conductive layer extending along one of said opposed surfaces, etching said electrically-conductive layer to provide a set of electrically-conductive tracks extending along the non-conductive substrate with at least one portion of the non-conductive substrate left free by the set of electrically-conductive tracks, forming a network of electrically-conductive lines coupleable with at least one light radiation source at said portion of said non-conductive substrate left free by the electrically-conductive tracks. Said forming operation includes selectively removing e.g. via laser etching a further electrically-conductive layer provided on said non-conductive substrate, or printing electrically-conductive material onto the non-conductive substrate. The electrically-conductive tracks and the network of electrically-conductive lines may be coupled with each other e.g. by means of electrically-conductive vias extending through the non-conductive substrate.

8 Claims, 7 Drawing Sheets

(51) Int. Cl.

| | |
|---|---|
| *H05K 3/12* | (2006.01) |
| *H05K 3/02* | (2006.01) |
| *H05K 5/06* | (2006.01) |
| *H05K 1/09* | (2006.01) |
| *F21V 19/00* | (2006.01) |
| *F21V 23/00* | (2015.01) |
| *H01L 33/00* | (2010.01) |
| *H01L 33/48* | (2010.01) |
| *H05K 3/18* | (2006.01) |
| *H05K 3/24* | (2006.01) |
| *H05K 3/42* | (2006.01) |
| *H05K 1/18* | (2006.01) |
| *F21Y 115/10* | (2016.01) |

(52) U.S. Cl.
CPC .......... *H01L 33/005* (2013.01); *H01L 33/483* (2013.01); *H05K 1/095* (2013.01); *H05K 3/027* (2013.01); *H05K 3/12* (2013.01); *H05K 3/184* (2013.01); *H05K 3/242* (2013.01); *H05K 3/428* (2013.01); *H05K 5/06* (2013.01); *F21Y 2115/10* (2016.08); *H05K 1/189* (2013.01); *H05K 2201/0154* (2013.01); *H05K 2201/10106* (2013.01); *H05K 2203/107* (2013.01)

(58) Field of Classification Search
CPC ......... H01L 24/16; H01L 24/18; H01L 24/24; H01L 24/81; F21K 9/90; F21V 19/005; F21V 23/005

USPC ......................................................... 257/99
See application file for complete search history.

(56) References Cited

U.S. PATENT DOCUMENTS

| | | | |
|---|---|---|---|
| 8,866,308 B2 * | 10/2014 | Roy | H01L 24/14 257/777 |
| 9,324,928 B2 * | 4/2016 | Zanotto | H01L 33/005 |
| 9,349,703 B2 * | 5/2016 | Chiu | H01L 24/23 |
| 2007/0290217 A1 | 12/2007 | Daniels | |
| 2008/0006161 A1 * | 1/2008 | Li | B82Y 10/00 101/32 |
| 2010/0007531 A1 * | 1/2010 | Fluhrer | H03K 17/964 341/34 |
| 2011/0092125 A1 * | 4/2011 | Gnade | D03D 1/00 445/24 |
| 2012/0021188 A1 * | 1/2012 | White | G09F 3/0292 428/195.1 |
| 2012/0187569 A1 * | 7/2012 | Hayashi | H01L 21/76885 257/774 |
| 2013/0000968 A1 | 1/2013 | Zhao et al. | |
| 2013/0039013 A1 | 2/2013 | Waegli et al. | |
| 2015/0069452 A1 | 3/2015 | Zanotto et al. | |
| 2016/0361910 A1 * | 12/2016 | Franck, III et al. | B32B 37/182 |
| 2017/0050456 A1 * | 2/2017 | Schell | B41M 5/0011 |
| 2017/0263826 A1 * | 9/2017 | Huska | H01L 33/46 |

* cited by examiner

METHOD OF MANUFACTURING SUPPORT STRUCTURES FOR LIGHTING DEVICES AND CORRESPONDING DEVICE

CROSS-REFERENCE TO RELATED APPLICATION

This application claims priority to Italian Patent Application Serial No. 102016000088158, which was filed Aug. 30, 2016, and is incorporated herein by reference in its entirety.

TECHNICAL FIELD

The description relates to lighting devices.

One or more embodiments may refer to lighting devices employing electrically-powered light radiation sources, e.g. solid-state light radiation sources, such as LED sources.

BACKGROUND

The field of lighting technology, e.g. in Solid State Lighting (SSL), increasingly demands lighting modules, e.g. LED modules, with short development and lead times.

The linear and flexible ("flex") LED modules which are employed nowadays may include a plurality of electrical units which are connected e.g. in parallel (and which include one or more LED strings or chains and the related driving circuitry) with a consequent increase of the supply currents delivered along the module.

This fact may affect the voltage drop on the supply line or "track" VDD and on the ground line GND, and therefore also the operation of the electrical units distributed along the LED module.

Another aspect which may acquire significance is linked to the possible use of Flexible Printed Circuit Boards (FPCBs) which may be implemented as rolls, so as to achieve quite long LED modules (e.g. having a length of a few metres), the possibility being given to omit jumpers or connectors for the connection of the various electrical units.

FPCB boards may include laminates of metal materials such as copper or aluminium (either single- or double-sided) which may require, in order to achieve a given circuit arrangement, various chemical processes as well as, in some cases, a specific machining, leading to rather long manufacturing times.

This aspect may be particularly critical in the case of reel-to-reel (R2R) processes, as opposed to methods based on laminar boards or elements (sheet-to-sheet).

In this regard, LED modules (e.g. modules of an elongated, optionally ribbon-like and flexible shape) may comprise a plurality of Single Electrical Units (SEUs) connected in parallel and arranged along a ribbon-shaped structure.

As previously stated, the electrical connection among the various SEUs distributed along the module may be achieved via two or more electrically-conductive lines or "tracks", e.g. having the functions of supply (VDD) and ground (GND), with the possible presence of further lines, having control and/or feedback functions, from the light radiation sources, e.g. in the case of multi-channel modules as RGB, RGBW or TW (True White).

A solution which may be resorted to in order to implement rather long LED modules may consist in using laminates which may be clad, e.g. only on one side, with a metal material such as copper or aluminium, so that said lines or tracks are rather wide and/or thick, thereby obtaining a high conductive section and therefore a low electrical resistance.

This solution, however, suffers from a drawback: in order to change the circuit layout, it may be necessary to completely redesign the FPCB support, possibly entailing the intervention of the component manufacturer, with a consequent increase in costs and lead time.

Moreover, the thickness of said conductive layer (e.g. of copper or aluminium) is usually standardized and limited to certain values, such as e.g. 35 μm, 75 μm and 105 μm (1 μm=$10^{-6}$ m), the presence of rather large thicknesses being prone to reduce the resolution of the lines or tracks, which may lead to a limitation regarding the possible use of small-sized (e.g. LED) components.

A thick conductive layer may also affect a key feature of the module, i.e. flexibility. In a complementary way, rather wide lines or tracks may lead to an increase of the width of the product as a whole, which may represent a disadvantage in various applications.

Another possible solution in order to implement rather long flexible LED modules consists in using laminates which are clad with a metal material (e.g. aluminium or copper) on both sides; said lines or tracks are implemented on the bottom conductive layer, which is subsequently connected to the top layer by means of so-called electrically-conductive vias. The interconnecting lines between said vias and the circuit with the components may be arranged on the top conductive layer.

In this case as well, a change of the circuit layout may impose redesigning the whole FPCB component completely, which again may require the intervention of the component manufacturer; this may lead to additional activities and/or to the need of using further tools, with a subsequent increase of costs and lead time.

SUMMARY

One or more embodiments aim at overcoming the previously outlined drawbacks.

According to one or more embodiments, said object may be achieved thanks to a method having the features set forth in the claims that follow.

One or more embodiments may also concern corresponding devices.

The claims are an integral part of the technical teaching provided herein with reference to one or more embodiments.

One or more embodiments may envisage different solutions, the possibility being given of implementing FPCB components having a high customization degree, by resorting either to single-sided or to double-sided clad substrates.

In one or more embodiments it is possible to employ hybrid techniques, which may be defined in the final product with possible reductions of manufacturing times.

One or more embodiments may employ laminates with a metal material of aluminium or copper (with or without an adhesive layer sandwiched between base layer and conductive layer(s)), the conductive lines or "tracks" being adapted to be implemented via a standard etching, e.g. chemical etching, method.

One or more embodiments may envisage the use of electrically-conductive vias at given positions in the module, the possibility being given of using said vias in a wide variety of possible configurations.

In one or more embodiments, said electrically-conductive vias may be implemented with standard techniques, e.g. by drilling holes and subsequently capping them, e.g. by means of an electrodeposition process.

One or more embodiments may offer one or more of the following advantages:

rapid and low-cost management, with possible customization, of new products such as e.g. linear and/or flexible LED modules, without negatively affecting the features (e.g. the electrical resistance) thereof;

the changes may be carried out directly by the assembler of the final product, without the need to involve the manufacturer of the FPCB component;

several different circuit layouts may be managed on one single FPCB component, the possibility being given of increasing the standardization level of the copper or aluminium clad laminates, e.g. as regards the possible use of a chemical etching;

high flexibility of the achievable modules.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

Figure 1:
FIGS. 1 to 10 show possible steps of one or more embodiments.
Figure 2:
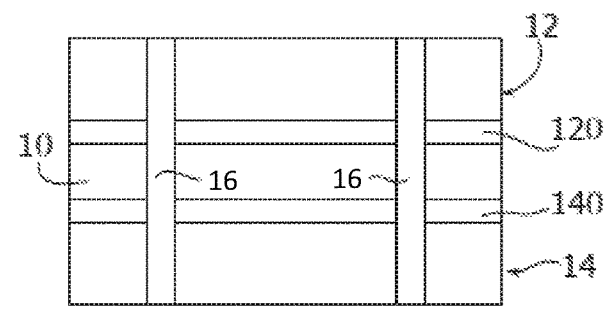
Figure 3:
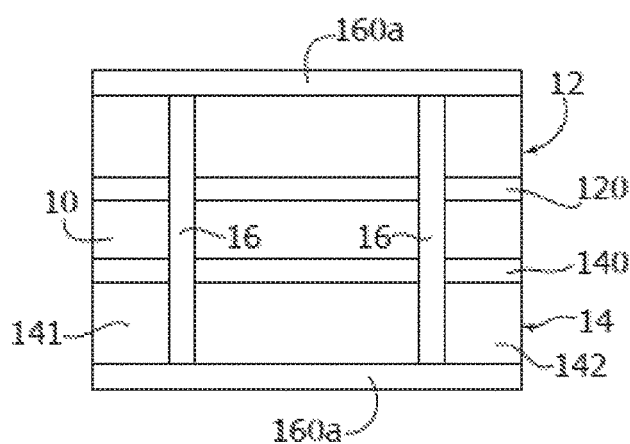

It will be appreciated that the Figures correspond to ideal cross sections of elongated (e.g. ribbon-shaped) elements, which may be considered as having indefinite length.

It will be appreciated, moreover, that for better clarity and simplicity of illustration the various Figures and the elements shown therein may not be drawn all to the same scale.

DETAILED DESCRIPTION

In the following description, various specific details are given to provide a thorough understanding of various exemplary embodiments. The embodiments may be practiced without one or more specific details, or with other methods, components, materials, etc. In other instances, well-known structures, materials or operations are not shown or described in detail to avoid obscuring various aspects of the embodiments.

Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in any suitable manner in one or more embodiments.

The headings provided herein are for convenience only, and therefore do not interpret the extent of protection or scope of the embodiments.

One or more embodiments may employ a laminate material including a core layer 10 (e.g. of polyimide (PI) or any other material, such as of organic material), adapted to be used as a base layer for a single-sided or double-sided FPCB module, with electrically-conductive layers, e.g. metal layers of aluminium or copper.

Said electrically-conductive layers, denoted e.g. as 12 and 14 in the figures, may have either the same thickness or different thicknesses.

For example, in the case of a double-sided solution as exemplified in FIGS. 1 to 10, there may be present a thin first (top or front) layer 12, having e.g. a thickness of 18 or 35 μm (1 μm=$10^{-6}$ m) and a thick second (lower or bottom) layer 14, having e.g. a thickness of 35, 70 or 105 μm (1 μm=$10^{-6}$ m).

In one or more embodiments, said electrically-conductive layer(s) 10 may be connected to base layer 10 by means of intermediate adhesive layers 120, 140, the presence whereof is not however mandatory.

One or more embodiments may envisage the implementation of the electrical connection of electrically-conductive layers 12, 14 by means of electrically-conductive vias. In one or more embodiments, two or more lines or "tracks" may be formed e.g. in bottom layer 14 by using a standard, e.g. chemical, etching process, while the circuit on the top layer may be obtained e.g. via laser etching or other methods of removing material selectively (that is, in certain zones and not others) such as e.g. mechanical etching (cutting wheel etching), plasma etching, PCB milling.

In this respect, one or more embodiments may take into account the difficulty of chemically etching conductive layers having different thicknesses, due to the different etching tolerances as a function of the conductor thickness.

One or more embodiments may envisage, as exemplified in FIGS. 1 to 10, in a base structure as exemplified in FIG. 1, the drilling of through holes (FIG. 2) adapted to be capped via an electrodeposition of electrically-conductive material, so as to originate (see FIG. 3) electrically-conductive vias 16 traversing structure 10, 12, 14 (including the optional adhesive layers 120 and 140).

Figure 4:
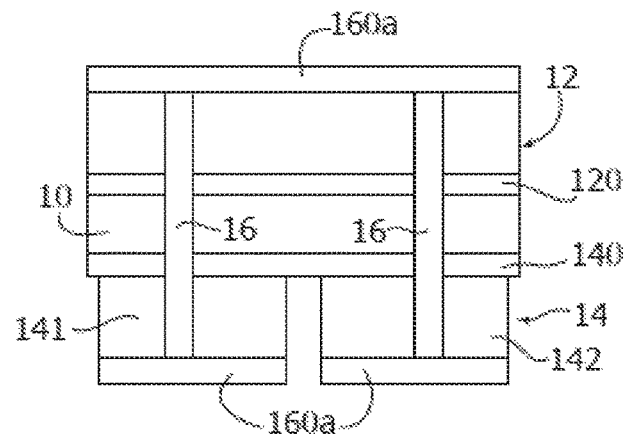

FIG. 4 exemplifies the possibility of subjecting bottom layer 140 (which may be coated, 160a, with the previously electro-deposited material) to a chemical etching, so as to create two or more electrically-conductive lines or tracks extending along the length of the structure shown in the Figures.

One or more embodiments may envisage, for example, the formation of two tracks, respectively denoted as 141 and 142. The set of tracks, exemplified herein by tracks 141, 142 may however include any number of tracks.

In one or more embodiments, the chemical etching treatment of layer 14 may be carried out so as not to affect the top or front conductive layer 12, for example by forming, above electro-deposited layer 160a, a protective film (e.g. a dry photopolymer film).

Figure 5:
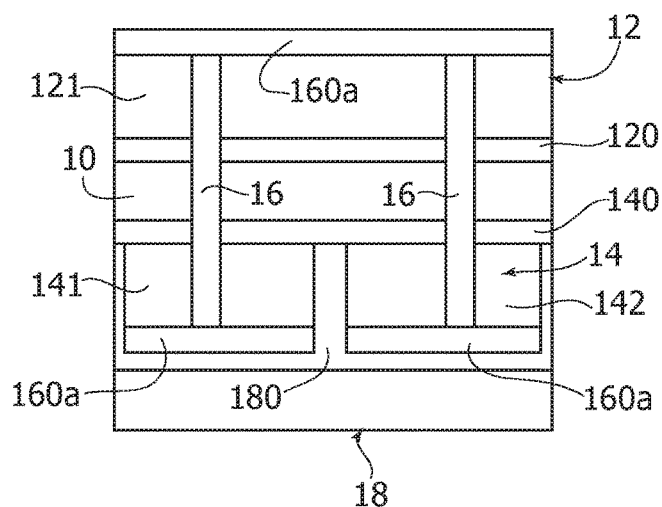

FIG. 5 exemplifies the possibility of applying a base layer 18 on tracks 141, 142, e.g. via ad adhesive connection with a material 180 which, as indicated in FIG. 5, may also penetrate the gaps between tracks 141, 142.

Figure 6:
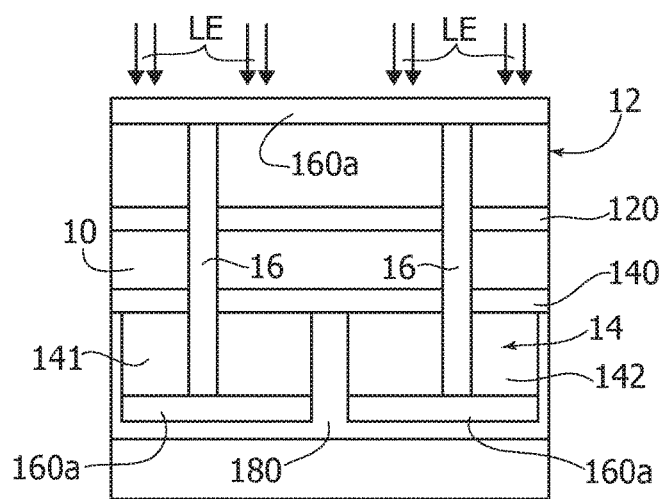
Figure 7:
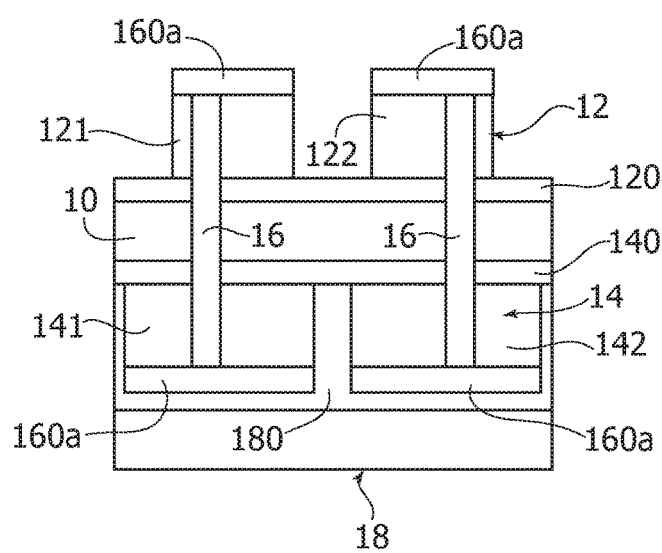

FIG. 6 exemplifies the possibility of subjecting top layer 12 to a LE etching (e.g. by means of a laser beam, using a UV- or a $CO^2$-based laser), so as to form into said layer a circuit network which is here shown, by way of example only, as two lines 121, 122 (FIG. 7).

In one or more embodiments, this sort of etching may be carried out more rapidly than a chemical etching.

Moreover, an etching such as a laser etching enables to manage more easily, also as regards a possible customization, the topology of the circuit network 121, 122.

This procedure may moreover enable to define, at the level of circuits, laminates having conductive layers of different thicknesses, which is rather difficult to achieve by means of a standard chemical etching.

Figure 8:
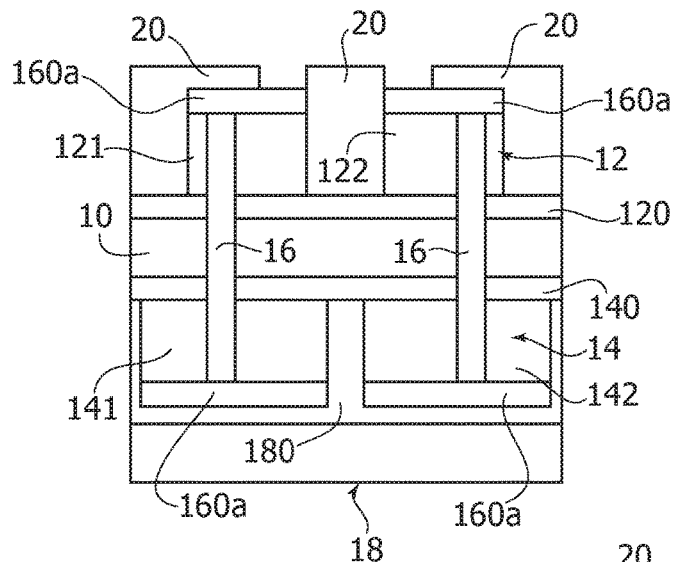

FIG. 8 exemplifies the possibility of applying, onto the conductive lines of the circuit network formed by way of laser etching LE (which are represented herein, by way of example only, as two lines 121, 122), a mask or cover lay 20, which may be silk-screen printed or of the type known as Liquid Photo Imageable (LPI), so as to originate protected (masked) areas which may host electrical contact pads.

After this step (which however is not strictly mandatory), a surface finishing may be carried out consisting e.g. in a silver immersion or any one of the treatments known as OSP (Organic Surface Protection), HASL (Hot Air Solder Level), ENIG (Electroless Nickel Immersion Gold), and on the portions of the electrically-conductive lines (e.g. 121, 122) of the circuit network formed via LE etching which are left free by mask 20 it is possible to form contact pads 22. On the pads 22 it is possible to apply solder masses or an electrically-conductive adhesive 24 (see FIG. 9) for mounting components such as e.g. electrically-powered light radiation sources (e.g. solid-state sources such as LED sources) or other electrical components, optionally via an SMD mounting operation.

Figure 10:
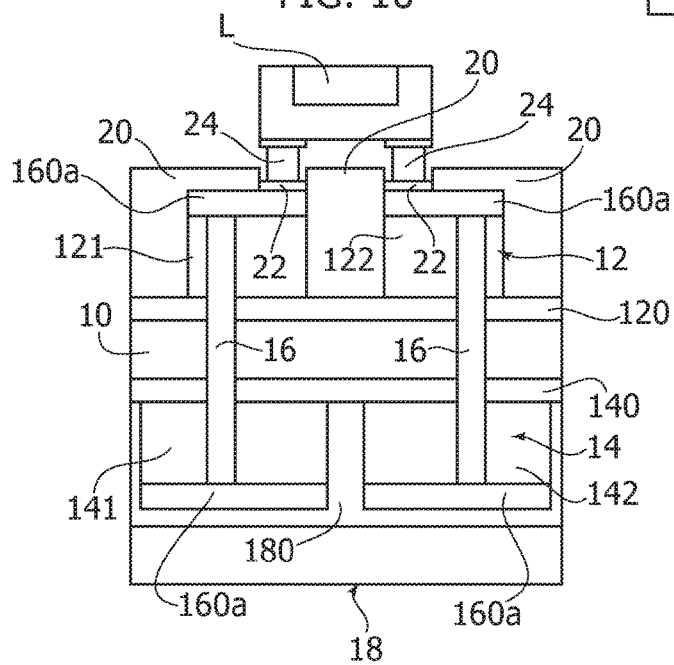
Figure 11:
FIGS. 11 to 19 show possible steps of one or more embodiments.

Such LEDs/components are schematically shown as L in FIG. 10.

One or more embodiments as exemplified in FIGS. 11 to 19 may envisage a base structure which once again exhibits a base layer 10 which is clad (in this case according to a single-sided solution) with a metal material such as aluminium or copper 14.

For reasons which will be better detailed in the following, in the illustration of embodiments as exemplified in FIGS. 11 to 19, reference 14 denotes the electrically-conductive coating located on the upper side of base layer 10. In one or more embodiments, as exemplified in FIGS. 11 to 19, two (or more) tracks previously denoted as 141 and 142 may be formed in said layer via a chemical etching process.

Moreover, on the same top layer of substrate 10, in the area where the electrically-conductive layer 14 has been removed in order to form the tracks 141, 142, there may be formed circuits obtained e.g. via ink printing. Both types of electrically-conductive lines (i.e. tracks 141, 142 and the circuits which are printed in the area which is left free) may then be connected e.g. via passive and/or active components such as resistors, diodes, transistors such as e.g. SMD components and/or components of the type currently referred to as zero ohm components: see e.g. en.wikipedia.org/wiki/Zero-ohm link.

Figure 12:
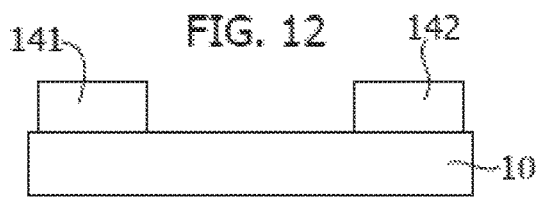

FIG. 12 exemplifies the condition wherein the electrically-conductive layer 14 has been chemically etched, so as to form tracks 141, 142 (which may be present in any number, therefore also in a number higher than two).

In one or more embodiments, tracks 141, 142 may be subjected to a surface finishing treatment as previously described (e.g. silver immersion, OSP, HASL, ENIG).

Figure 13:
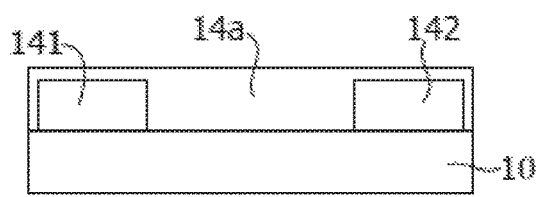
Figure 14:
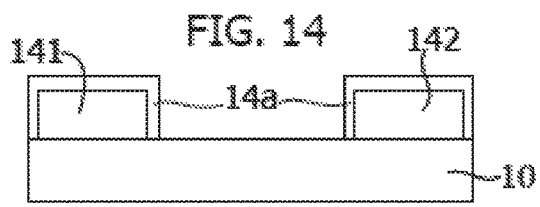

FIG. 13 exemplifies the possibility of applying a protective layer (i.e. a mask layer, such as e.g. a dry photopolymer film 14a) onto tracks 141, 142. Said protective mask layer may then be removed, as exemplified in FIG. 14, so as to remain only to cover tracks 141, 142 and leave the area between them free (or in general an area left free by tracks 141, 142 on the surface of the base substrate 14).

In one or more embodiments, in said area there may be formed, e.g. via conductive ink printing, a circuit network 30, which is exemplified herein as two electrical lines 301 and 302: this solution is of course merely exemplary, because the shape and the arrangement of circuit 30 may be chosen at will, also thanks to the high degree of flexibility which may be achieved with the printing process.

Figure 15:
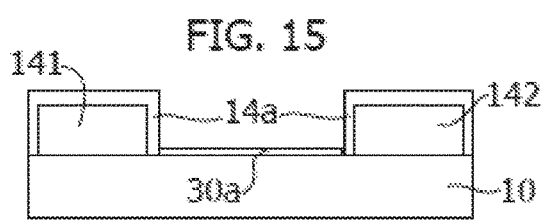
Figure 16:
Figure 17:
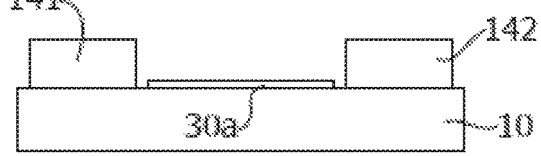
Figure 18:
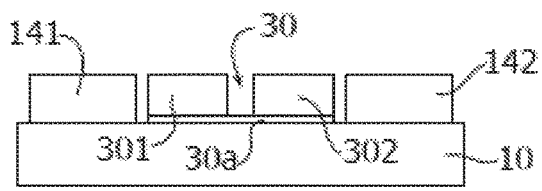
Figure 19:
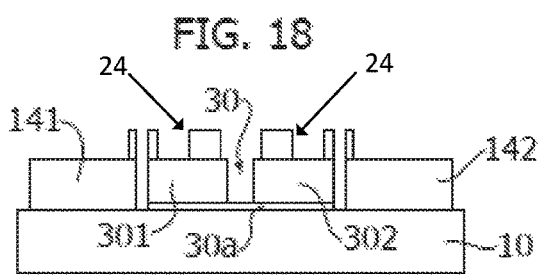
Figure 20:
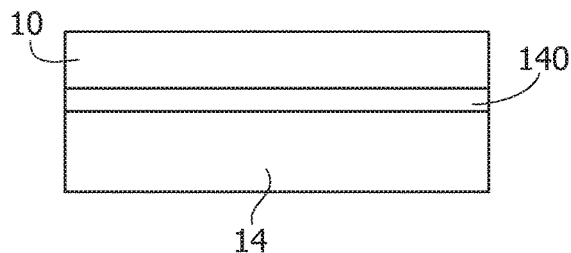
FIGS. 20 to 29 show possible steps of one or more embodiments.

FIGS. 15 to 17 exemplify various operations which may accompany the implementation of the circuit network 30 exemplified as two electrically-conductive lines 301, 302.

Specifically, FIGS. 15 and 16 exemplify that protective layer 14a protecting tracks 141, 142 has been removed, while the top face of base 10 has been subjected to a surface treatment 30a (e.g. a corona or plasma treatment) adapted to simplify the formation of circuit 30 via a printing process.

The deposition of such an ink onto the (generally planar) surface of substrate 10 may take place e.g. by means of a stencil technique.

In one or more embodiments, the dry thickness of the ink of circuit 30 may be chosen so as to correspond to the thickness of a conductive layer which has been chemically etched. This is exemplified in FIG. 17, wherein the printed lines 301, 302 are shown as having the same thickness as lines or traces 141, 142 obtained by means of chemical etching.

Ink printing may be a more rapid process than chemical etching, and may lead to an easy management, also as regards customization, of the features of circuit 30, e.g. by means of simply substituting masks or print templates (or optionally by modifying a software controlling the printing operation, e.g. in the case wherein the printing operation of circuit 30 is performed as 3D printing).

After the optional possible application of a further mask or cover on the upper face of the electrically-conductive layer (which may be carried out by means of screen-printing or with a protective material such as Liquid Photo Imageable (LPI), which is not explicitly shown in the Figures), on lines 301, 302 it is possible to apply a solder paste or an electrically-conductive adhesive material adapted to enable mounting components L.

Figure 9:
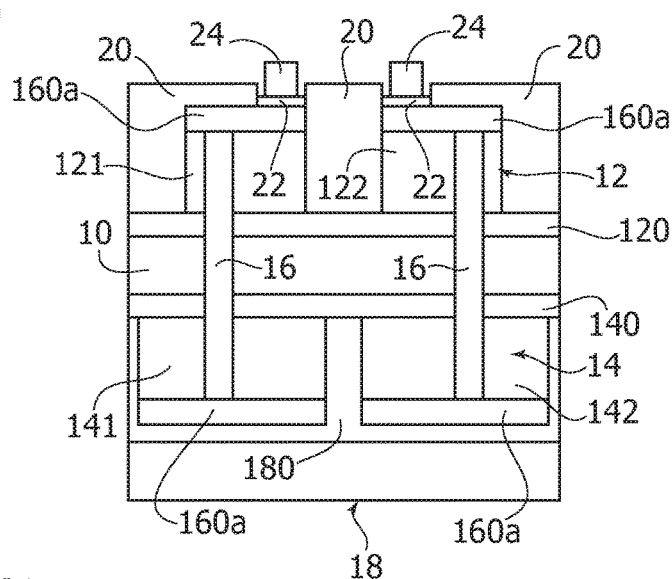

This may be carried out according to implementation criteria similar to what shown with reference to FIGS. 9 and 10.

As previously stated, in one or more embodiments tracks 141, 142 (obtained via chemical etching) and lines 301, 302 (obtained by printing) may be connected with (e.g. SMD) components having an ohmic value virtually amounting to zero.

FIGS. 20 to 29 exemplify (without intending to limit all the possible combinations) the possibility of using one or more features or operation steps previously described with reference to FIGS. 1 to 19 in different combinations from what has been exemplified in the foregoing.

For this reason, in FIGS. 20 to 29 parts or elements corresponding to parts or elements already described with reference to FIGS. 1 to 19 are denoted with the same references, without repeating the description thereof.

For example, FIGS. 20 to 29 show embodiments wherein the starting point is a base layer 10 coupled (e.g. via an adhesive layer 140) to an electrically-conductive (e.g. aluminium or copper) layer 14.

In one or more embodiments as exemplified in FIGS. 20 to 29, forming the set of tracks 141, 142 (once again, the number of said tracks may be chosen at will) may take place according to a procedure substantially corresponding to what has been exemplified with reference to FIGS. 1 to 10.

This also applies to the possibility of implementing electrically-conductive vias 16 through the structure, in such a way as to achieve an electrical interconnection of electrically-conductive layer 14 with the opposite side of base film 10.

In this case, according to criteria substantially similar to what has been exemplified with reference to FIGS. 11 to 19, a circuit network 30 may be implemented by printing with electrically-conductive inks.

Figure 21:
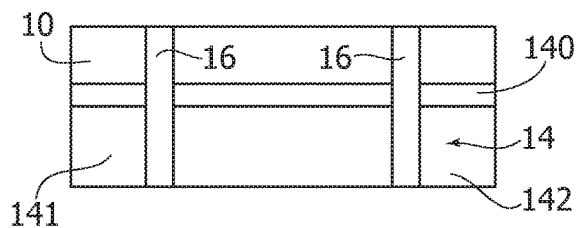
Figure 22:
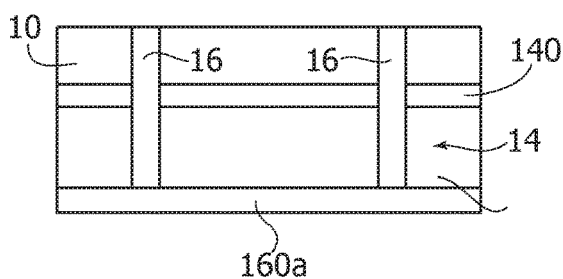

In this respect, FIG. 21 exemplifies the possibility of drilling, through base structure 10, 14, 140 (it must be remembered that the presence of intermediate layer 140 is optional) through holes 140, which may then be capped e.g. by means of an electrodeposition process, so as to form electrically-conductive vias 16 (with an optional layer of surface plating 160a on the outer surface of layer 14).

Figure 23:
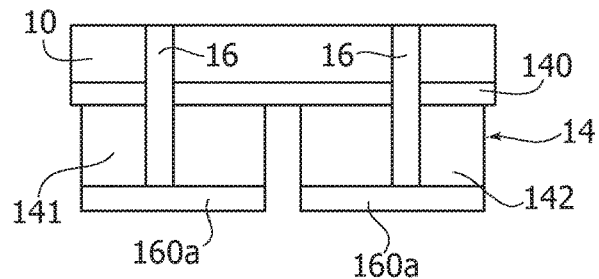

As exemplified in FIG. 23, layer 14 may be subjected to chemical etching or engraving, so as to form the set of (two or more) electrically-conductive tracks 141, 142.

Figure 24:
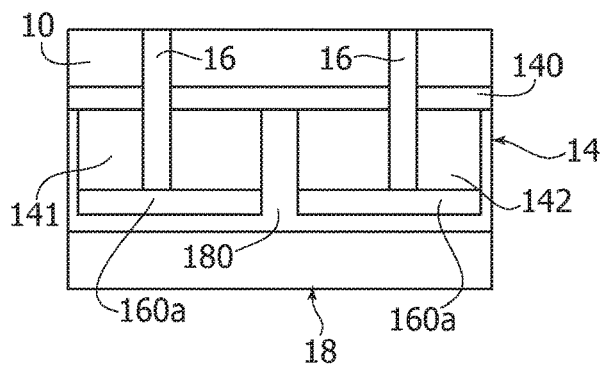

FIG. 24 exemplifies the possibility of forming, in order to cover tracks 141, 142, a bottom layer 18 which may be adhesively connected to the structure, as shown at 180.

Figure 25:
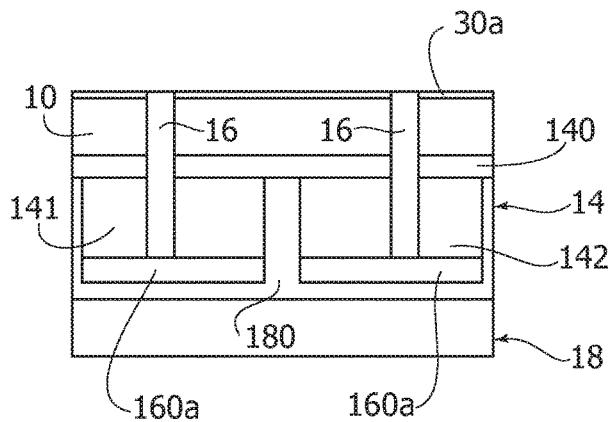
Figure 26:
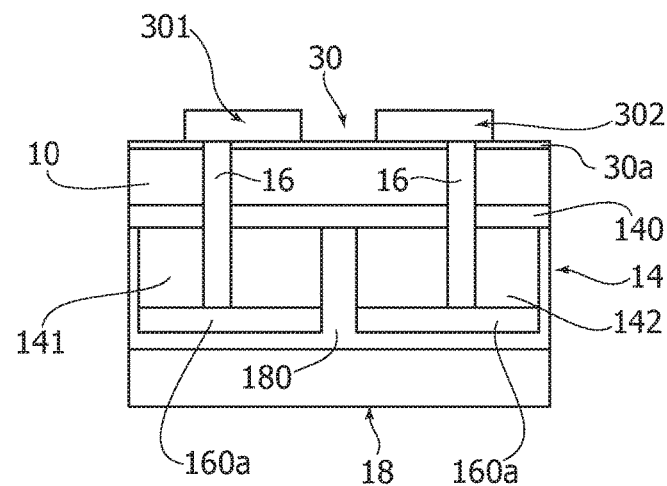

FIG. 25 exemplifies the possibility of subjecting front (or top) surface of layer 10 to a surface treatment (e.g. a corona or plasma treatment), denoted as 30a, so as to make the material of base layer 10 printable (e.g. with ink printing techniques), the possibility being given again to remove oxidation at the upper end of the electrically-conductive vias 16 (which may be made e.g. of copper).

In one or more embodiments, by acting according to a procedure which substantially resembles to what previously described for the embodiments exemplified in FIGS. 11 to 19, circuit 30, again exemplified as two lines 301 and 302, may be formed by printing.

In this case, too, such a process may be more rapid than a chemical process, while enabling a high degree of possible customization of the circuit by replacing masks, tools (or by modifying software in the case of 3D printing).

Figure 27:
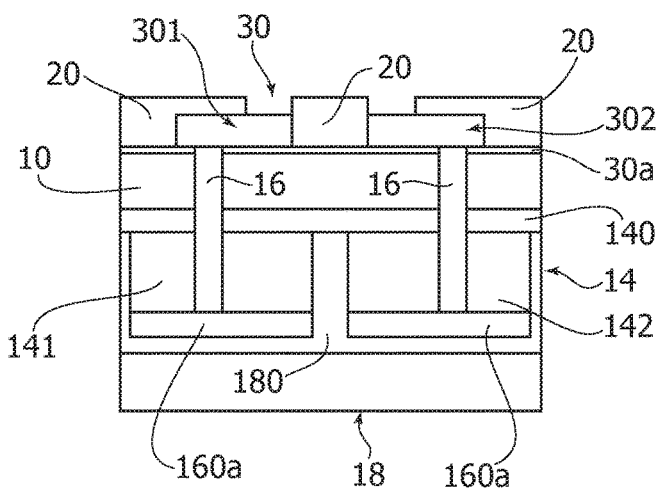
Figure 28:
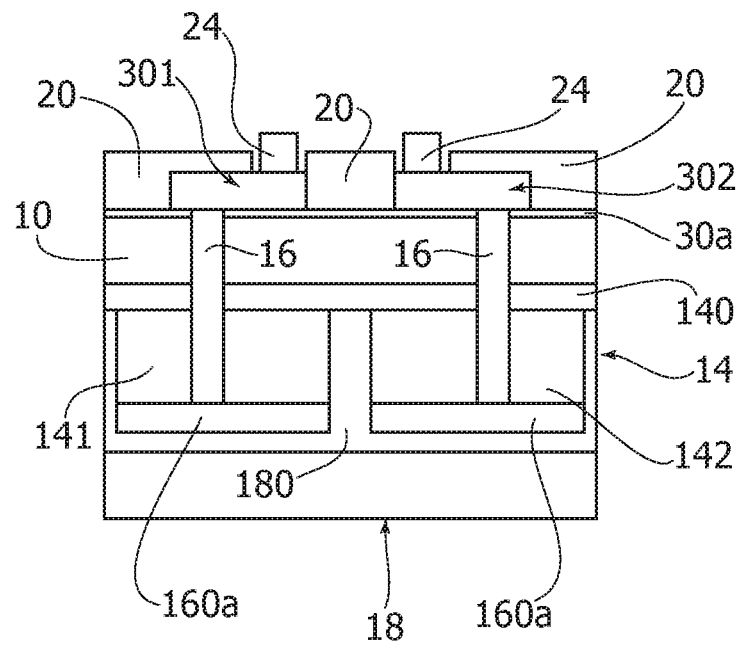
Figure 29:
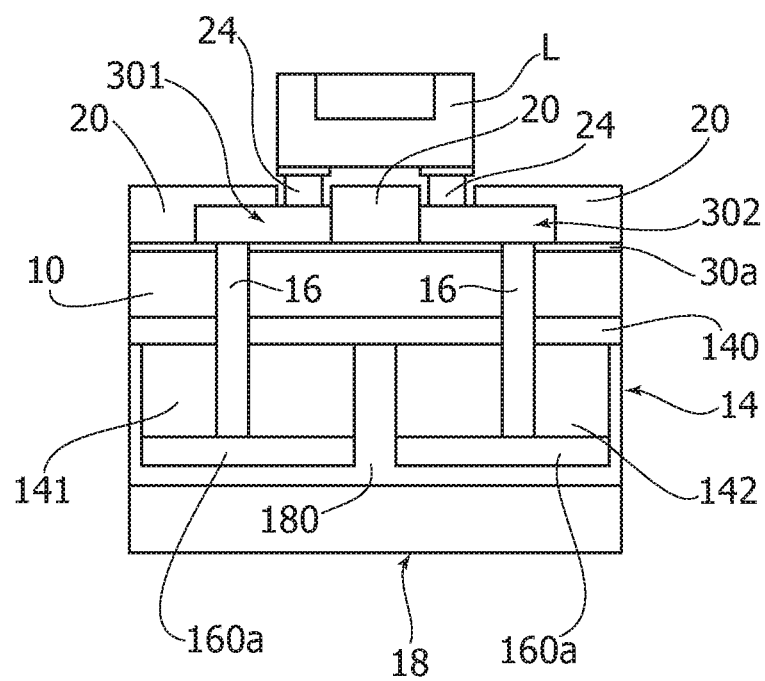

FIG. 27 exemplifies the possibility of applying onto circuit 30, by acting substantially according to the procedures exemplified in FIG. 8 and following, the masking or protective layer 20 (solder mask or cover lay), which may be applied e.g. via screen-printing or via a technique known as Liquid Photo Imageable, LPI, so as to leave certain chosen portions of circuit 30 free.

Such portions of circuit 30 which are left free by protective material 20 may then be provided with soldering masses or with an electrically-conductive adhesive 24, which enable mounting components L (LEDs and/or others) to complete a lighting device structure.

One or more embodiments may therefore concern a method of manufacturing support elements for lighting devices, the method including:
providing an elongated, electrically non-conductive substrate (e.g. 10) with opposed surfaces, said substrate having an electrically-conductive layer (e.g. 14) extending along one of said opposed surfaces,
subjecting to (e.g. chemical) etching said electrically-conductive layer, to provide a set of electrically-conductive tracks (e.g. 141, 142) extending along said non-conductive substrate (10) with at least one portion of said non-conductive substrate (i.e. the opposed surface, in the embodiments exemplified in FIGS. 1 to 10 or in the embodiments exemplified in FIGS. 20 to 29; the area of the same surface lying between the lines 141, 142 in the embodiments exemplified in FIGS. 11 to 19) left free by said set of electrically-conductive tracks,
forming a network of electrically-conductive lines (e.g. 121, 122 or 301, 302) coupleable with at least one electrically-powered light radiation source (e.g. L) at said portion of said electrically non-conductive substrate left free by said electrically-conductive tracks, wherein said forming includes:
i) selectively removing, e.g. via laser etching (LE), a further electrically-conductive layer (layer 12, so as to form lines 121, 122, in the embodiments exemplified in FIGS. 1 to 10) provided on said non-conductive substrate, or
ii) printing electrically-conductive material (e.g. 30, so as to form lines 301, 302 in the embodiments exemplified in FIGS. 10 to 19 or in the embodiments exemplified in FIGS. 20 to 29) onto said non-conductive substrate, and
electrically coupling (e.g. 16 or 32) said set of electrically-conductive tracks and said network of electrically-conductive lines.

One or more embodiments may include:
forming said network of electrically-conductive lines on the other of said opposed surfaces of said non-conductive substrate, and
coupling said electrically-conductive tracks and said network of electrically-conductive lines by means of electrically-conductive vias (e.g. 16) extending through said non-conductive substrate.

One or more embodiments may include:
providing said at least one portion of said non-conductive substrate left free by said electrically-conductive tracks at said one of said opposed surfaces along which said etched, electrically-conductive layer extends (e.g. between tracks 141 and 142 in the embodiments exemplified in FIGS. 1 to 10),
electrically coupling said electrically-conductive tracks and said network of electrically-conductive lines by means of electrically-conductive elements (e.g. 32) mounted at said one of said opposed surfaces of the non-conductive substrate.

In one or more embodiments, said electrically-conductive elements may include components, optionally SMD components, with zero ohmic value.

One or more embodiments may include providing a base layer (e.g. 18) covering said set of electrically-conductive tracks at said one of said opposed surfaces of non-conductive substrate (10).

In one or more embodiments, said electrically non-conductive substrate may include a ribbon-like flexible member.

In one or more embodiments, said at least one portion of said non-conductive substrate left free by said set of electrically-conductive tracks (namely the portion onto which electrically-conductive material e.g. 30 can be printed so as to form lines 301, 302 in the embodiments exemplified in FIGS. 10 to 19 or in the embodiments exemplified in FIGS. 20 to 29) may include a flat portion.

One or more embodiments may include electrically coupling at least one electrically-powered light radiation source, optionally of the LED type, to said one network of electrically-conductive lines.

One or more embodiments may include mounting said at least one electrically-powered light radiation source onto said network of electrically-conductive lines with SMD technology.

One or more embodiments may concern a lighting device including:
a support element produced with the method according to one or more embodiments, and
at least one electrically-powered light radiation source, electrically coupled with said network of electrically-conductive lines.

In one or more embodiments, said at least one electrically-powered light radiation source may include a LED source (L).

Without prejudice to the basic principles, the implementation details and the embodiments may vary, even appreciably, with respect to what has been described herein by way of non-limiting example only, without departing from the extent of protection.

The extent of protection is defined by the annexed claims.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A method of manufacturing support elements for lighting devices, the method comprising:
   providing a printed circuit board module by:
      providing an elongated, electrically non-conductive substrate with opposed surfaces, said substrate having an electrically-conductive layer extending along one of said opposed surfaces,
      etching said electrically-conductive layer to provide a set of electrically-conductive tracks extending along said non-conductive substrate with at least one portion of said electrically non-conductive substrate left free by said set of electrically-conductive tracks at the one of said opposed surfaces along which said set of electrically-conductive tracks extends,
      printing at said at least one portion of said electrically non-conductive substrate left free by said set of electrically-conductive tracks, a network of electrically-conductive lines coupleable with at least one electrically-powered light radiation source,
   mounting at least one electrically-powered light radiation source on the printed circuit board module, wherein said mounting comprises coupling the at least one electrically-powered light radiation source exclusively to the network of electrically-conductive lines via solder masses or an electrically-conductive adhesive; and
   electrically coupling said set of electrically-conductive tracks and said network of electrically-conductive lines by means of electrically-conductive elements mounted at the one of said opposed surfaces of the non-conductive substrate, wherein the electrically-conductive elements include SMD components with zero ohmic value.

2. The method of claim 1, further comprising:
   forming said network of electrically-conductive lines on the other of said opposed surfaces of said non-conductive substrate, and
   electrically coupling said set of electrically-conductive tracks and said network of electrically-conductive lines by means of electrically conductive vias extending through said non-conductive substrate.

3. The method of claim 1, further comprising providing a base layer covering said set of electrically conductive tracks at said one of said opposed surfaces of the non-conductive substrate.

4. The method of claim 1, wherein said electrically non-conductive substrate includes a ribbon-like flexible member.

5. The method of claim 1, wherein said at least one portion of said non-conductive substrate left free by said set of electrically-conductive tracks includes a flat portion.

6. The method of claim 1, further comprising electrically coupling to said network of electrically-conductive lines at least one electrically-powered light radiation source of the LED type.

7. The method of claim 1, wherein the electrically-conductive elements are arranged directly between the set of electrically-conductive tracks and the network of electrically-conductive lines.

8. The method of claim 1, wherein the electrically-conductive layer is arranged over an outer surface of the electrically non-conductive substrate.

* * * * *